US012573744B2

(12) United States Patent
Prabhu Gaunkar et al.

(10) Patent No.: US 12,573,744 B2
(45) Date of Patent: Mar. 10, 2026

(54) WIDEBAND ANTENNAS IN GLASS THROUGH DIRECT VIA FEEDING AND GLASS STACKING

(71) Applicant: Intel Corporation, Santa Clara, CA (US)

(72) Inventors: Neelam Prabhu Gaunkar, Chandler, AZ (US); Georgios C. Dogiamis, Chandler, AZ (US); Telesphor Kamgaing, Chandler, AZ (US); Aleksandar Aleksov, Chandler, AZ (US); Brandon Rawlings, Chandler, AZ (US); Veronica Strong, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 929 days.

(21) Appl. No.: 17/561,542

(22) Filed: Dec. 23, 2021

(65) Prior Publication Data

US 2023/0208009 A1     Jun. 29, 2023

(51) Int. Cl.
| | |
|---|---|
| H01Q 1/22 | (2006.01) |
| H01L 23/498 | (2006.01) |
| H01Q 9/04 | (2006.01) |
| H05K 1/181 | (2026.01) |

(52) U.S. Cl.
CPC ..... H01Q 1/2283 (2013.01); H01L 23/49827 (2013.01); H01Q 9/0407 (2013.01); *H05K 1/181* (2013.01); *H05K 2201/10098* (2013.01); *H05K 2201/10515* (2013.01); *H05K 2201/1053* (2013.01)

(58) Field of Classification Search
CPC .... H01Q 1/2283; H01Q 9/0407; H01Q 1/526; H01Q 5/40; H01Q 9/0457; H01Q 13/06; H01Q 13/085; H01Q 9/0414; H01Q 21/065; H01L 23/49827; H01L 21/486; H01L 23/15; H01L 23/49816; H01L 23/49822; H05K 1/181; H05K 2201/10098; H05K 2201/10515; H05K 2201/1053
See application file for complete search history.

(56) References Cited

U.S. PATENT DOCUMENTS

| | | | | |
|---|---|---|---|---|
| 10,756,438 B2 * | 8/2020 | Chen | .................... | H01Q 9/0414 |
| 11,410,921 B2 * | 8/2022 | Jain | ....................... | H01L 21/486 |
| 2016/0049723 A1 * | 2/2016 | Baks | .................... | H01Q 9/0457 |
| | | | | 343/848 |
| 2017/0213794 A1 * | 7/2017 | Baek | ....................... | H01L 21/56 |
| 2020/0058592 A1 * | 2/2020 | Kim | .................... | H01L 21/4857 |

* cited by examiner

*Primary Examiner* — Seung H Lee
(74) *Attorney, Agent, or Firm* — Schwabe, Williamson & Wyatt P.C.

(57) ABSTRACT

Embodiments disclosed herein include electronic packages. In an embodiment, an electronic package comprises a core, where the core comprises glass. In an embodiment, a buildup layer is over the core. In an embodiment, a patch antenna with a first patch is under the core, and a second patch is over a surface of the core opposite from the first patch. In an embodiment, the electronic package further comprises a via through the core and coupled to the patch antenna.

17 Claims, 17 Drawing Sheets

WIDEBAND ANTENNAS IN GLASS THROUGH DIRECT VIA FEEDING AND GLASS STACKING

TECHNICAL FIELD

Embodiments of the present disclosure relate to electronic packages, and more particularly to electronic packages with antennas incorporated into glass cores.

BACKGROUND

With a surge in demand for high-speed communication services, low latency solutions with high data rates and bandwidth density have emerged. To meet the requirements of higher bandwidth density, there has been a push to operate at millimeter wave or RF frequencies where wider bandwidths can lead to higher data rates. Based on the range of communication (i.e., long versus short), wired or wireless channels can both be used at millimeter wave frequencies. Typically, antennas for such architectures need to encompass the entire transmission bandwidth and may need to have bandwidths greater than 50 GHz. Antenna solutions, such as the use of antenna arrays typically using stacked patch antennas or Vivaldi antennas, are known to meet such targets. For stacked patch launchers, to achieve high bandwidths from on-package implementations, multiple buildup layers are required. A through via passing through the buildup layers and the core layer is often used to feed the parasitic metal patches. Typically, design rules dictate specific dimensions for through vias, with thicker layers leading to larger via diameters and therefore leading transitions with increased footprint. Accordingly, the overall footprint of such large transitions limits the number of parallel channels that can be utilized and reduces the available bandwidth.

EMBODIMENTS OF THE PRESENT DISCLOSURE

Described herein are electronic packages with antennas incorporated into glass cores, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, the overall footprint of the antenna designs in electronic packages is limited by large transitions, design rules and wavelength-dependence of antenna elements. As such, there is a limit to the number of parallel channels that can be utilized. This reduces the available bandwidth of such structures. Accordingly, embodiments disclosed herein utilize glass cores that can be patterned with a laser assisted etching process. The laser assisted etching process enables much smaller feature sizes. Therefore, antennas can be implemented on the package and within package cores without any limitation on minimum achievable through-via diameters. Additionally, reduction in antenna feed transitions reduces the overall footprint occupied, and maximizes the number of parallel channels that can be used.

Generally, embodiments disclosed herein enable wideband antennas implemented on the core (e.g., a glass core) and buildup layers over the core. Some embodiments may also utilize a superstrate layer to achieve wider bandwidths. The laser assisted etching used to form the vias through the core enables narrow transitions through the package core, thereby minimizing bandwidth reduction from large transitions. Such narrow antenna feeds through the package core are necessary for sub-THz applications.

Figure 1A:
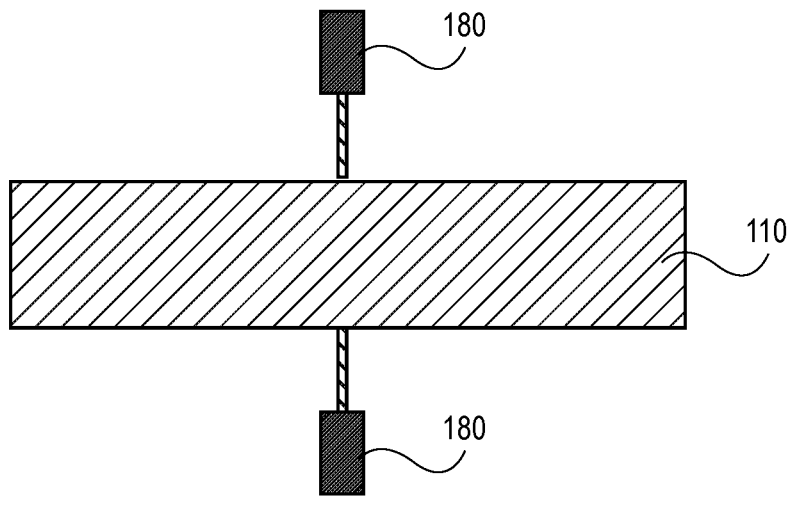
FIGS. 1A-1C are cross-sectional illustrations depicting a laser assisted etching process for forming vias through a core, in accordance with an embodiment.

FIGS. 1A-3C are provided in order to provide context for the laser assisted etching process that is used to fabricate features of the antennas disclosed herein. While FIGS. 1A-1C provide general illustrations of forming vias into and through the core, it is to be appreciated that other structures, such as via planes and other antenna structures (e.g., stacked patches, Vivaldi structures, etc.) may also be formed using similar laser assisted etching processes.

Figure 1B:
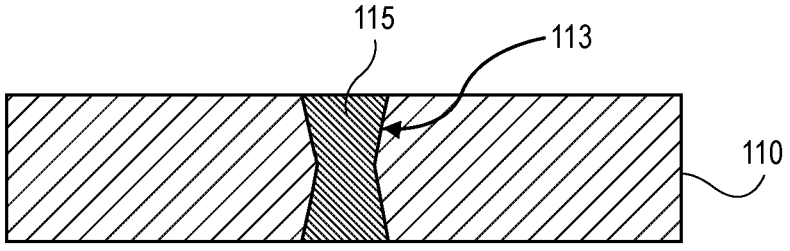
Figure 1C:
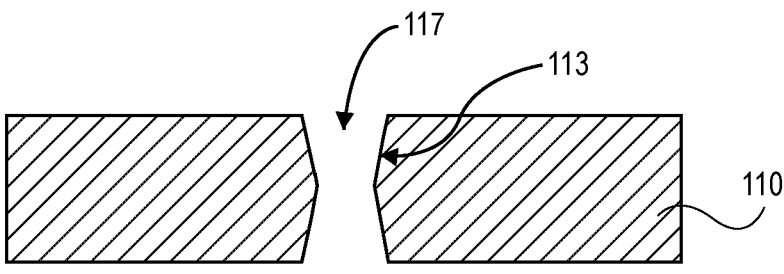
Figure 2A:
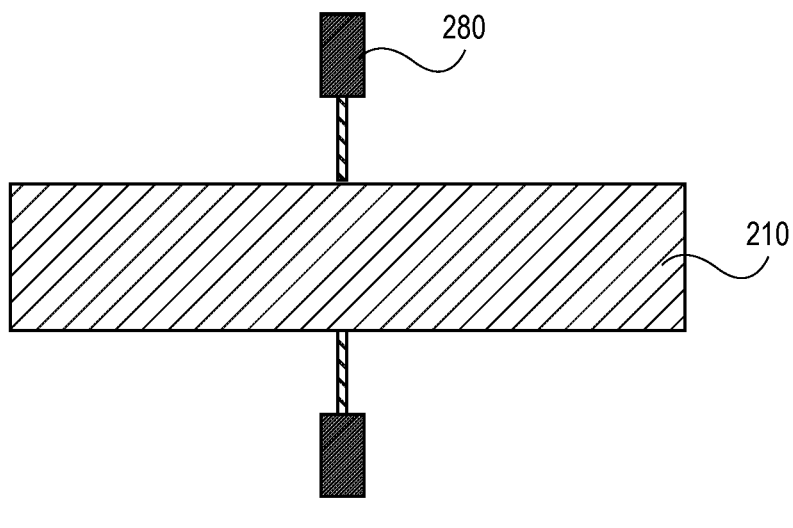
FIGS. 2A-2C are cross-sectional illustrations depicting a laser assisted etching process for forming blind vias into a core, in accordance with an embodiment.
Figure 2B:
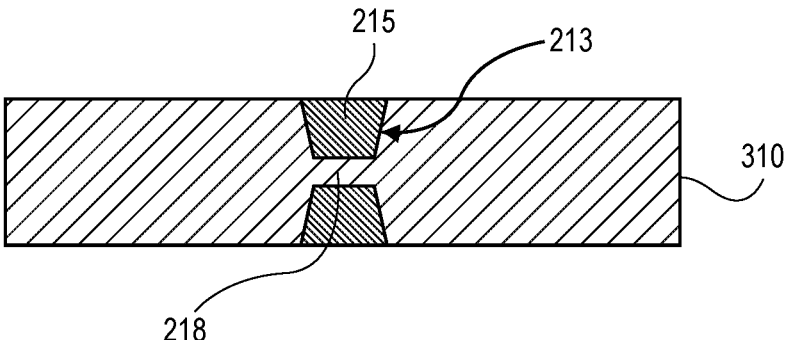
Figure 2C:
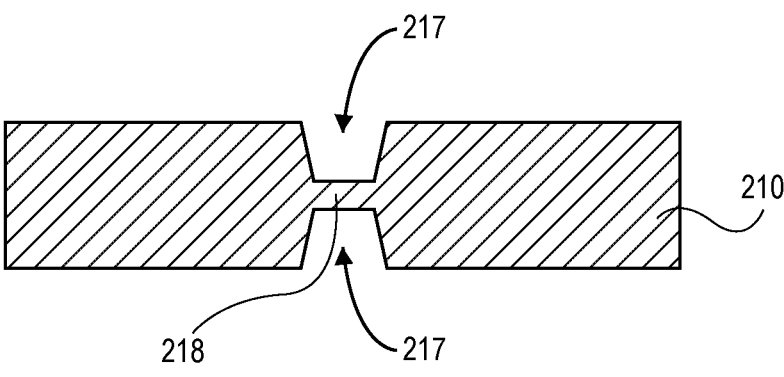
Figure 3A:
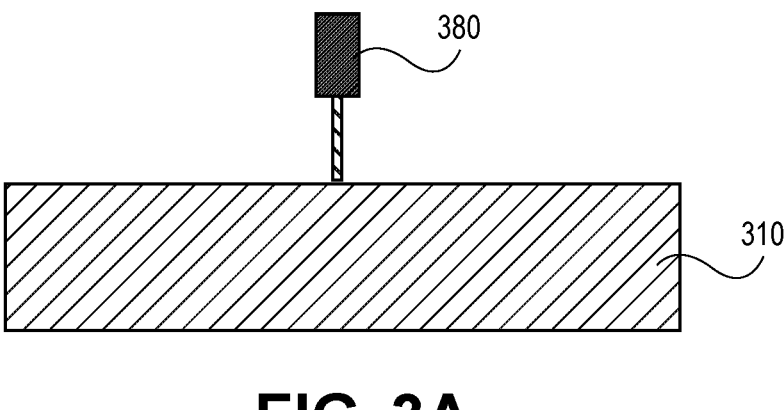
FIGS. 3A-3C are cross-sectional illustrations depicting a laser assisted etching process for forming a blind via into a core, in accordance with an embodiment.
Figure 3B:
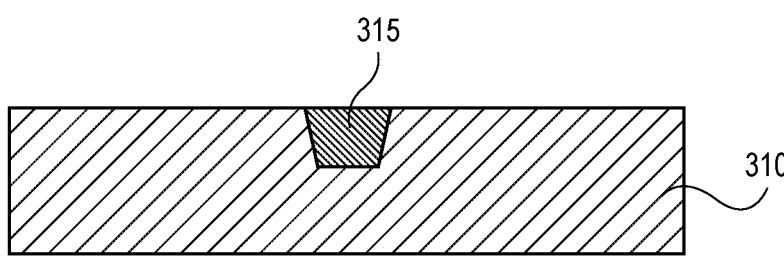
Figure 3C:
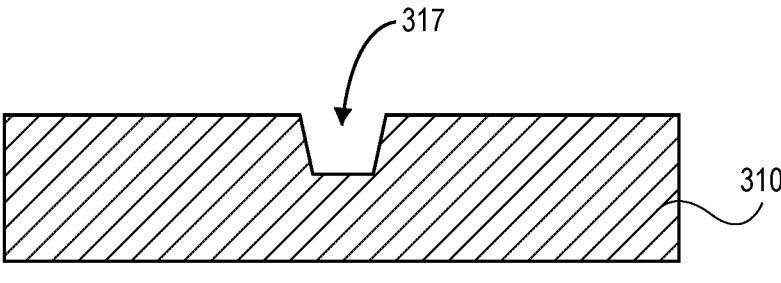

Referring now to FIGS. 1A-3C, three series of cross-sectional illustrations that depict processes for forming features in glass cores with laser assisted etching processes are shown, in accordance with an embodiment. In FIGS. 1A-1C, a through core via opening is formed. In FIGS. 2A-2C a pair of blind via openings on opposite surfaces of the core are formed. In FIGS. 3A-3C a blind via opening into the top surface of the core is formed. The openings formed in FIGS. 1A-3C can then be filled with materials (e.g., conductive materials) using various plating or other deposition processes in order to manufacture antenna structures within a glass core.

Referring now to FIGS. 1A-1C, a series of cross-sectional illustrations depicting a process for fabricating openings in a glass core 110 is shown, in accordance with an embodiment.

Referring now to FIG. 1A, a cross-sectional illustration of a glass core 110 is shown, in accordance with an embodiment. In an embodiment, the glass core 110 may have a thickness that is between approximately 50 μm and approximately 1,000 μm. As used herein, approximately may refer to a value that is within 10% of the stated value. For example, approximately 50 μm may refer to a value between 45 μm and 55μm. Though, it is to be appreciated that other thicknesses (larger or smaller) may also be used for the glass core 110. In an embodiment, a laser 180 is used to expose a region of the glass core 110. As shown in FIG. 1A, the exposure may be made on both sides (i.e., the top surface of the glass core 110 and the bottom surface of the glass core 110). A single laser 180 may be used, or multiple lasers may be used. In an embodiment, the laser 180 is exposed over the glass core 110 at locations where via openings are desired.

Referring now to FIG. 1B, a cross-sectional illustration of the glass core 110 after the laser 180 exposure is completed is shown, in accordance with an embodiment. As shown, the laser 180 exposure may result in the formation of exposed regions 115. In an embodiment, the glass core 110 may comprise a glass material that is able to be morphologically changed upon exposure to a laser 180. For example, the morphological change may result in the microstructure of the glass core 110 transforming to a crystalline structure from an amorphous structure. Accordingly, the exposed region 115 is shown with a different shading than the glass core 110.

In an embodiment, the laser 180 exposure may result in an exposed region 115 that has a tapered sidewall 113. In the instance where both sides of the glass core 110 are exposed (as is the case shown in FIG. 1A), the exposed region 115 may have a double tapered profile. That is, widths of the exposed region 115 at a top surface of the glass core 110 and at a bottom surface of the glass core 110 may be wider than a width at a middle of the glass core 110. In some instances, such a sidewall 113 profile may be referred to as an hourglass shaped profile.

Referring now to FIG. 1C, a cross-sectional illustration of the glass core 110 after the exposed region 115 is removed is shown, in accordance with an embodiment. In an embodiment, removal of the exposed region 115 may result in the formation of a via opening 117. The via opening 117 may pass entirely through a thickness of the glass core 110. In an embodiment, the via opening 117 may be a high aspect ratio via opening 117. As used herein a "high aspect ratio" may refer to an aspect ratio (width:depth) that is approximately 5:1 or greater, with the width being measured at a narrowest point through a thickness of the via opening 117. In other embodiments, the aspect ratio of the via opening 117 may be approximately 10:1 or greater, approximately 20:1 or greater, or approximately 50:1 or greater.

Referring now to FIGS. 2A-2C, a series of cross-sectional illustrations depicting a process for forming blind structures into a glass core 210 is shown, in accordance with an embodiment. Instead of forming an opening entirely through the glass core 210, structures that extend partially through a thickness of the core 210 are provided.

Referring now to FIG. 2A, a cross-sectional illustration of a glass core 210 is shown, in accordance with an embodiment. In an embodiment, the glass core 210 may be substantially similar to the glass core 110 described in greater detail above. For example, the glass core 210 may have a thickness between approximately 50 μm and approximately 1,000 μm. In an embodiment, lasers 280 may expose portions of the glass core 210. In an embodiment, the laser 280 exposure in FIG. 2A may be different than the laser 180 exposure in FIG. 1A. For example, an intensity or duration of the laser 280 exposure may be less than the intensity or duration of the laser 180 exposure in FIG. 1A.

Referring now to FIG. 2B, a cross-sectional illustration of the glass core 210 after exposed regions 215 are formed is shown, in accordance with an embodiment. In an embodiment, the exposed regions 215 do not extend entirely through a thickness of the glass core 210. For example, a region 218 may be provided between the top exposed region 215 and the bottom exposed region 215. In some instances, the exposed regions 215 still include tapered sidewalls 213. Since the exposed regions 215 are formed from only a single side, the sidewalls 213 may only have a single taper. That is, the exposed regions 215 may not be hourglass shaped.

Referring now to FIG. 2C, a cross-sectional illustration of the glass core 210 after the exposed regions 215 are removed to form openings 217 is shown, in accordance with an embodiment. In an embodiment, the exposed regions 215 may be removed with an etching process that is selective to the exposed regions 215 over the rest of the glass core 210. As shown, the openings 217 do not extend entirely through the glass core 210. In such embodiments, the openings 217 may be referred to as blind openings since they do not pass through the glass core 210.

Referring now to FIGS. 3A-3C, a series of cross-sectional illustrations depicting a process for forming a blind opening 317 is shown, in accordance with an embodiment.

Referring now to FIG. 3A, a cross-sectional illustration of a glass core 310 is shown, in accordance with an embodiment. In an embodiment, the glass core 310 may be substantially similar to the glass cores 110 and 210 described in greater detail above. For example, the glass core 310 may have a thickness between approximately 50 μm and approximately 1,000 μm. In an embodiment, a laser 380 may be used to expose a surface of the glass core 310. In contrast to embodiments described in greater detail above, the laser 380 exposure may only be provided on a single surface of the glass core 310.

Referring now to FIG. 3B, a cross-sectional illustration of the glass core 310 after the laser exposure to form an exposed region 315 is shown, in accordance with an embodiment. In an embodiment, the exposed region 315 may be a region that has a morphology change compared to the rest of the glass core 310. For example, the morphology change may be the transition from an amorphous structure to a crystalline structure. In an embodiment, the exposed region 315 may not extend entirely through a thickness of the glass core 310. That is, the exposed region 315 may be suitable for forming blind structures.

However, it is to be appreciated that in some embodiments, a laser 380 exposure on a single surface of the glass core 310 can be used to form an exposed region 315 that extends through an entire thickness of the glass core 310. That is, it is not necessary to use an exposure on both sides of the glass core 310 in order to form through core structures. In such an embodiment, the sidewall profile of the exposed region 315 may have a single taper, instead of the hour-glass shaped taper shown in FIG. 1B.

Referring now to FIG. 3C, a cross-sectional illustration of the glass core 310 after the exposed region 315 is removed is shown, in accordance with an embodiment. In an embodiment, the removal of the exposed region 315 may result in an opening 317 being formed into the surface of the glass core 310. In an embodiment, the opening 317 may be a blind opening. In other embodiments, the opening 317 may pass entirely through a thickness of the glass core 310.

Several antenna topologies can be created using the laser assisted etching processes described in greater detail above. Some embodiments include stacked patch antennas, patch antennas, monopole or dipole antennas, slot dipole antennas, Yagi-Uda antennas, Vivaldi antennas, tapered slot antennas, horn antennas, bow-tie antennas, inverted-F antennas, slot antennas, slotted waveguide antennas etc. For each of these antennas, the radiating element size depends on the frequency range of interest. Typically, the radiating element is set to be a half-wavelength at the desired resonance frequency. For an antenna created in a glass core with a dielectric constant between 3 and 10, Table 1 shows some wavelength ranges at different operational frequencies.

TABLE 1

| Frequency (GHz) | Wavelength at $\in_r = 3$, mm | Wavelength at $\in_r = 10$, mm |
|---|---|---|
| 60 | 2.88 | 1.58 |
| 140 | 1.24 | 0.68 |
| 260 | 0.66 | 0.36 |
| 300 | 0.57 | 0.31 |

Based on the wavelengths seen in Table 1, the glass core thickness is selected appropriately. Typical ranges for glass core thicknesses may be between approximately 50 μm and approximately 1,000 μm. This implies that most of the antennas described herein can be created with ease in the glass core. Further, if additional spacing is needed, some features can be extended into the adjoining package buildup layers or into a superstrate. For embodiments described herein, exemplary antenna structures are shown as stacked patch antennas or Vivaldi antennas. Though, it is to be appreciated that any antenna topology can be used in accordance with embodiments described herein.

Figure 4A:
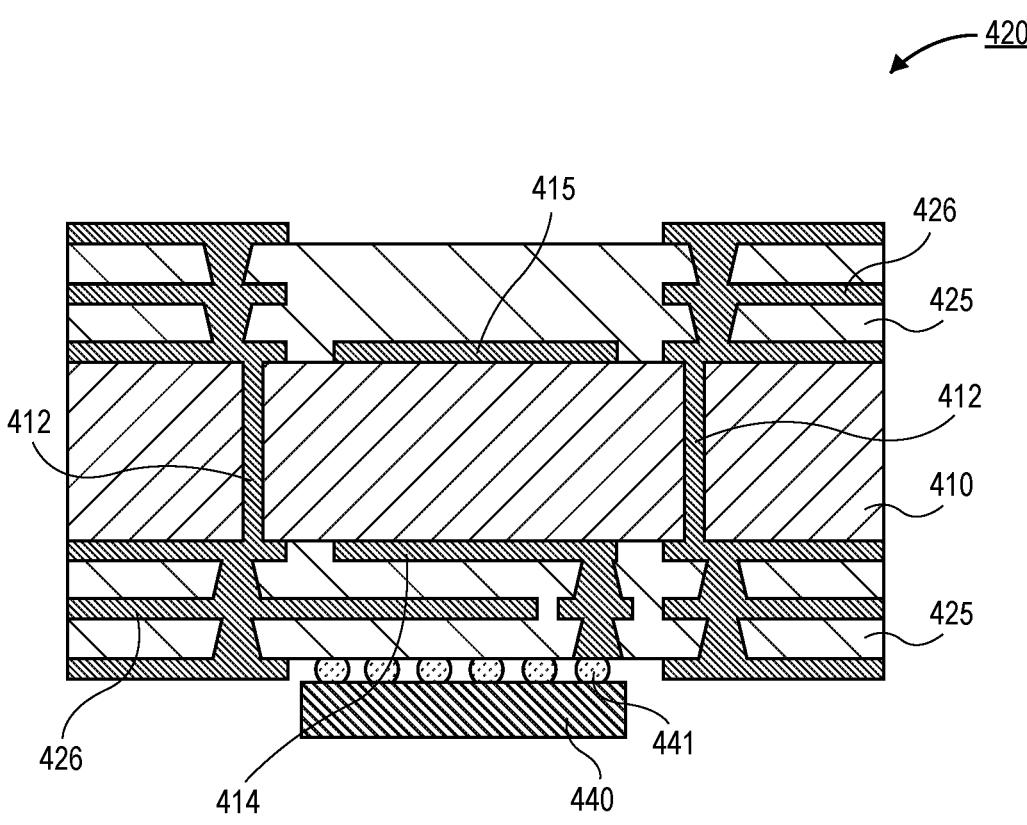
FIG. 4A is a cross-sectional illustration of an electronic package with a stacked patch antenna design, in accordance with an embodiment.

Referring now to FIG. 4A, a cross-sectional illustration of an electronic package 420 is shown, in accordance with an embodiment. In an embodiment, the electronic package 420 comprises a core 410. The core 410 may be a glass core with a thickness between approximately 50 μm and approximately 1,000 μm. Buildup layers 425 may be provided above and below the core 410. Conductive routing 426 (e.g., pads, traces, vias, etc.) may be provided in the buildup layers 425. In an embodiment, a die 440 may be coupled to the bottom buildup layer 425 by interconnects 441. In an embodiment, the die 440 may be a transceiver die suitable for operation within the mm-wave frequency spectrum.

In an embodiment, an antenna structure is provided in the electronic package 420. For example, the antenna structure may be a stacked patch antenna structure. In such an embodiment, a first patch 414 may be provided below the core 410 and a second patch 415 may be provided above the core 410. The core 410 serves as a dielectric layer between the two patches 414 and 415. In such an embodiment, the antenna may radiate upwards through the top buildup layer 425 and out of the electronic package 420. In an embodiment, vias 412 may pass through the core 410. The vias 412 may be part of shielding that surrounds the antenna. In some embodiments, the vias 412 are a plurality of discrete vias. In other embodiments, the vias 412 may be part of a single via plane that wraps around a perimeter of the antenna.

Figure 4B:
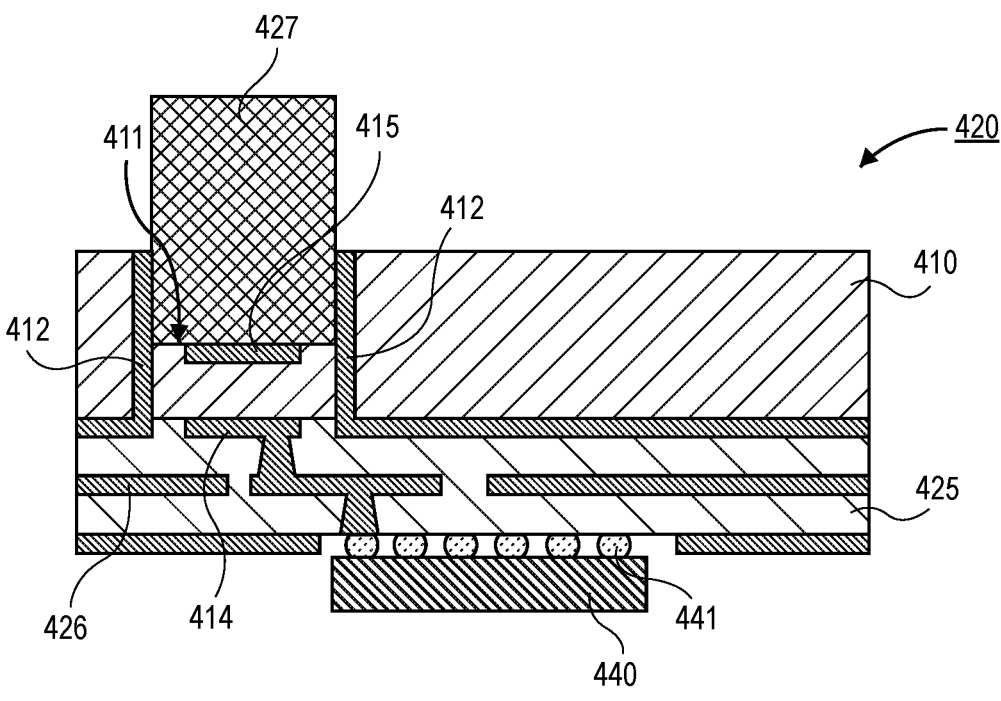
FIG. 4B is a cross-sectional illustration of an electronic package with a stacked patch antenna design with a patch recessed into the core and a waveguide coupled to the patch, in accordance with an embodiment.

Referring now to FIG. 4B, a cross-sectional illustration of an electronic package 420 is shown, in accordance with an additional embodiment. In an embodiment, the electronic package 420 comprises a core 410. The core 410 may be substantially similar to the core 410 in FIG. 4A. For example, the core 410 may be a glass core. Buildup layers 425 may be provided below the core 410. Conductive routing 426 may be provided through the buildup layer. For example, vias and traces may couple the die 440 and interconnects 441 to the bottom patch 414.

In an embodiment, the antenna may be formed in a recess 411 of the core 410. That is, the top patch 415 may be provided along the recessed surface 411. The recessed surface 411 may be formed with a blind via etching process, such as those described in greater detail above. Recessing the top patch 415 allows for the thickness of the dielectric core 410 to be tuned to a desired thickness in order to allow for a desired operational frequency. In an embodiment, a waveguide 427 may be inserted into the recess. The waveguide 427 couples with the antenna in order to propagate the signal in a desired direction. Through core vias 412 may be provided through the core 410 around the antenna and the waveguide 427. It is to be appreciated that other materials not shown in FIG. 4B may also surround the waveguide 427 within and/or outside the cavity. Such materials may be, for example, epoxies or polymers used for mechanical stability, waveguide cladding, and/or as a connector mating structure.

Figure 4C:
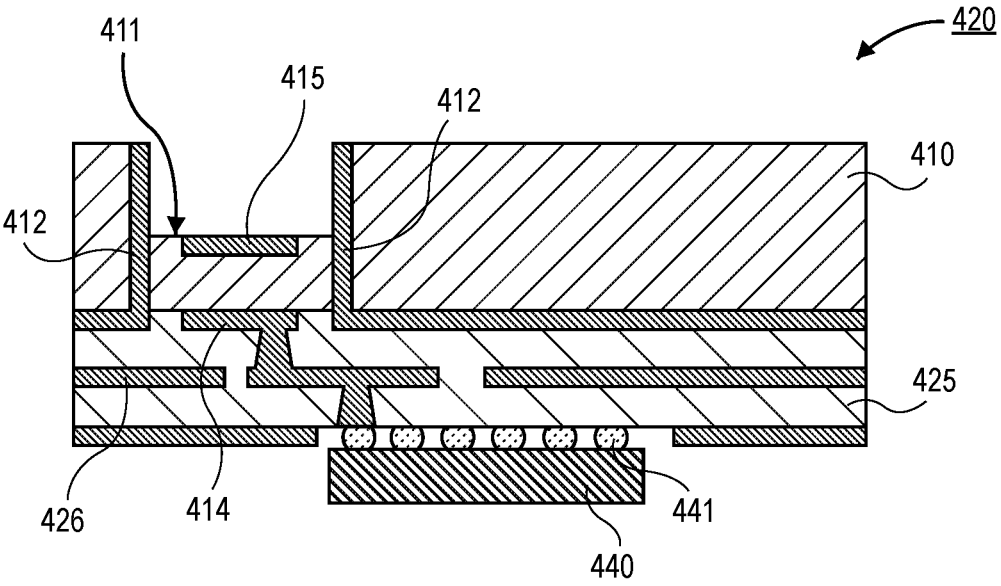
FIG. 4C is a cross-sectional illustration of an electronic package with a stacked patch antenna design with a patch recessed into the core, in accordance with an embodiment.

Referring now to FIG. 4C, a cross-sectional illustration of an electronic package 420 is shown, in accordance with an additional embodiment. In an embodiment, the electronic package 420 in FIG. 4C may be substantially similar to the electronic package 420 in FIG. 4B, with the exception of the waveguide 427. That is, the waveguide 427 is omitted from the embodiment shown in FIG. 4C. Instead of propagating a signal into the waveguide 427, the antenna in FIG. 4C propagates the signal into free space. In some instances, such an embodiment may be suitable for imaging applications that utilize mm-wave electromagnetic radiation. In some instances the cavity may be filled with a polymer or epoxy material that will not substantially impact the electromagnetic radiation.

Figure 5A:
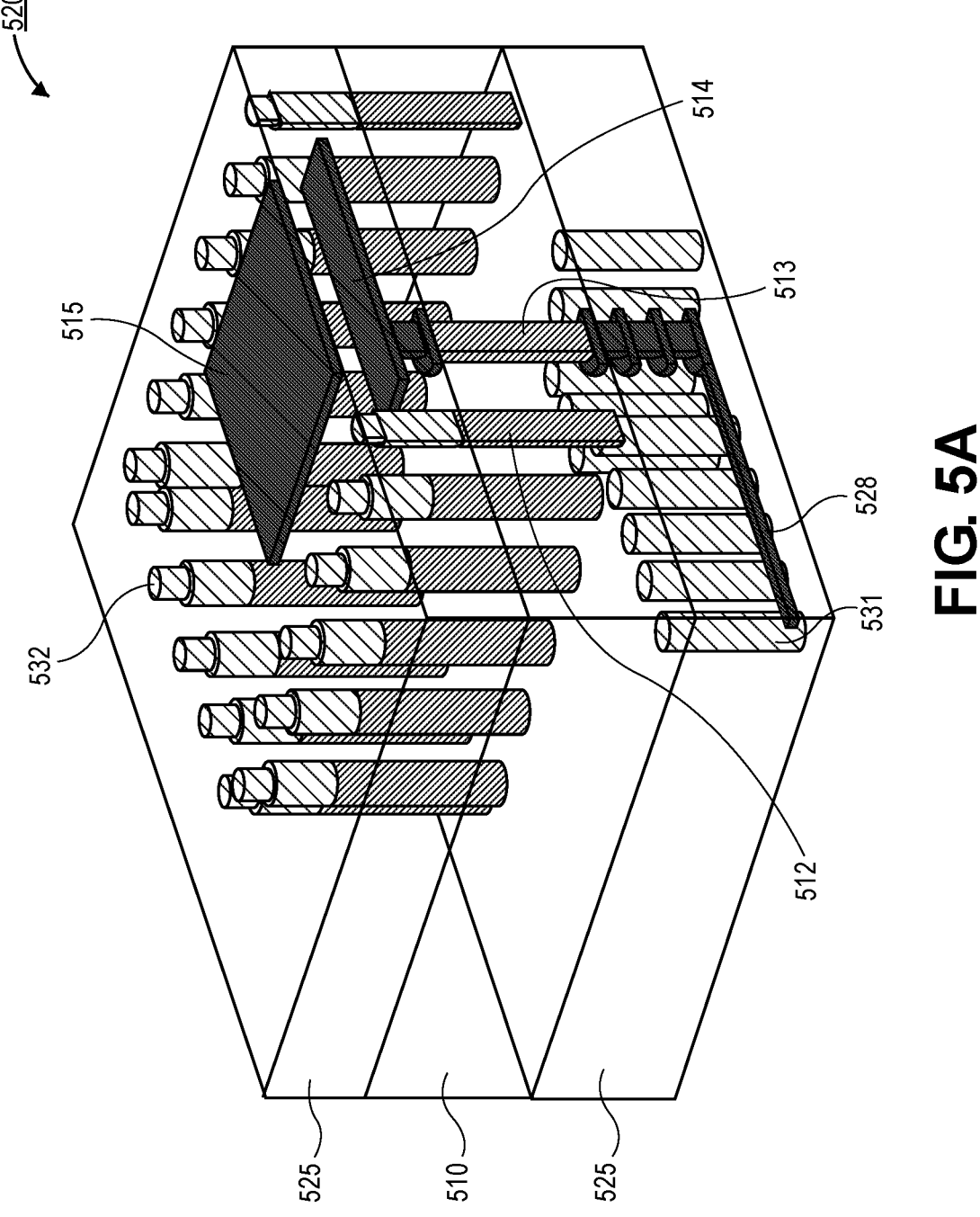
FIG. 5A is a perspective view illustration of an electronic package with a stacked patch antenna with vias through the core, in accordance with an embodiment.
Figure 5B:
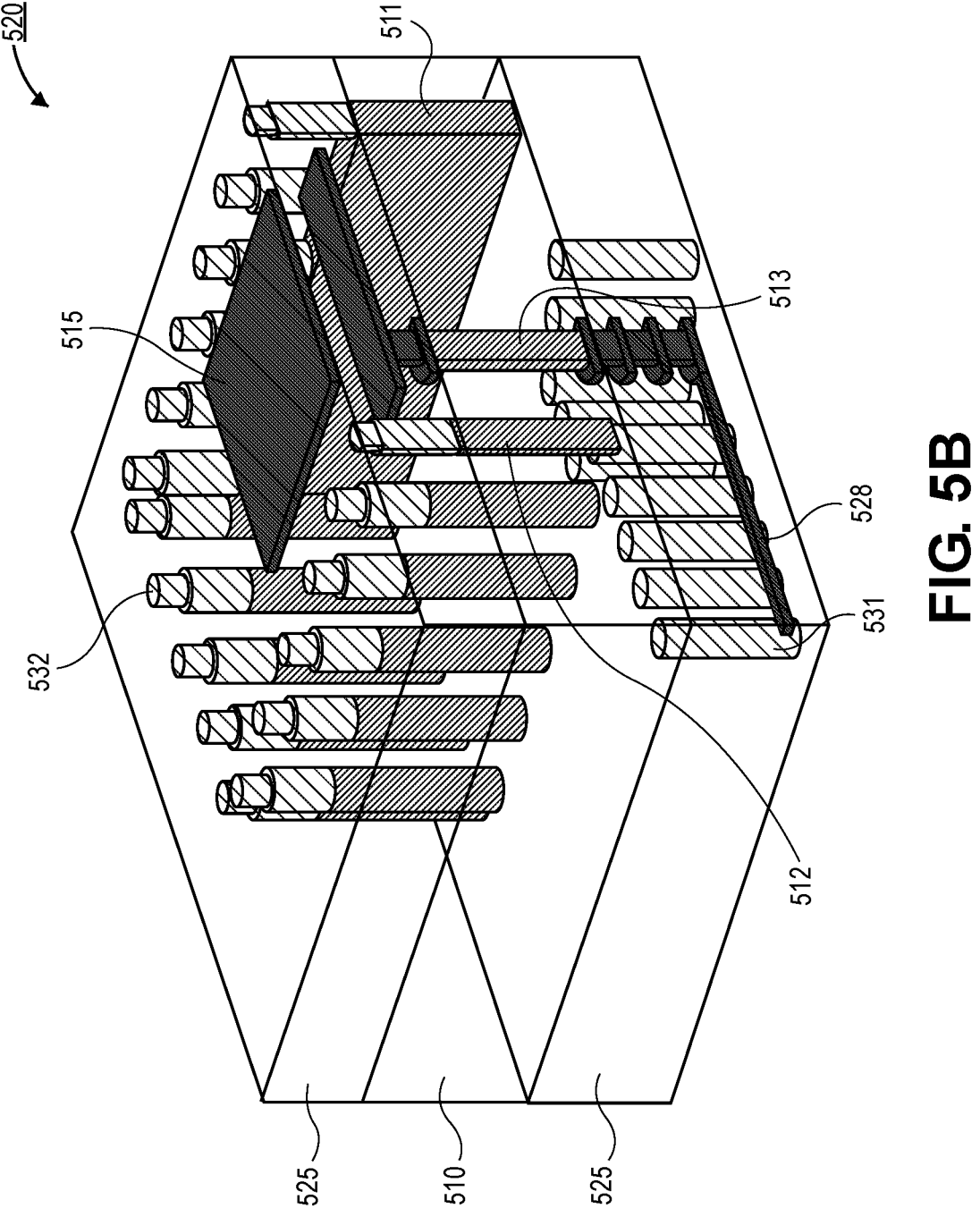
FIG. 5B is a perspective view illustration of an electronic package with a stacked patch antenna with vias and planes through the core, in accordance with an embodiment.

Referring now to FIGS. 5A and 5B, perspective view illustrations of electronic packages 520 are shown, in accordance with various embodiments. In FIGS. 5A and 5B, the buildup layers are shown as a single layer, but it is to be appreciated that the buildup layers may be a plurality of laminated layers. Additionally, it is to be appreciated that the front surface illustrated in FIGS. 5A and 5B may not be the true edge of the electronic package 520. Instead, the conductive features (e.g., vias 532, 512, etc.) may wrap around an entire perimeter of the patches 514 and 515.

Referring now to FIG. 5A, a perspective view illustration of an electronic package 520 is shown, in accordance with an embodiment. In an embodiment, the electronic package comprises a core 510, such as a glass core. Buildup layers 525 may be provided above and below the core 510. In an embodiment isolation vias 531 may be provided in the bottom buildup layers 525, and isolation vias 532 may be provided in the top buildup layers. The bottom isolation vias 531 may surround a feed line 528 for the antenna, and the top isolation vias 532 may surround the bottom patch 514 and the top patch 515 of the antenna.

In an embodiment, a via 513 through the core 510 may couple the bottom patch 514 to the feed line 528. Additional shielding vias 512 may be provided through the core 510 around a perimeter of the antenna. In an embodiment, a diameter of the vias 512 may be substantially similar to the diameter of the isolation vias 532. As used herein, substantially similar dimensions may refer to values that are within ten percent of each other. For example, a diameter substantially similar to a diameter of 10 µm may refer to a diameter between 9 µm and 11 µm. In some instances, each isolation via 532 is directly coupled to one of the vias 512 through the core 510. In an embodiment, the vias 512 may have a diameter between approximately 10 µm to approximately 300 µm. Similarly the feeding via 513 may have a diameter between approximately 10 µm and approximately 300 µm. The relatively small diameter of the vias 512, 513 is enabled by the laser assisted etching process, such as those described in greater detail above.

Referring now to FIG. 5B, a perspective view illustration of an electronic package 520 is shown, in accordance with an additional embodiment. The electronic package 520 in FIG. 5B may be substantially similar to the electronic package 520 in FIG. 5A, with the exception of there being a via plane 511 instead of a plurality of vias 512. In the illustrated embodiment, the via plane 511 is shown on the right side of the antenna (i.e. patches 514 and 515). However, it is to be appreciated that all of the vias 512 may optionally be replaced with a via plane 511.

In some instances, the required dimensions of the antenna may extend past the thickness of the core and the buildup layers. In such instances, a superstrate may also be added to the electronic package. Examples of electronic packages 620 that may use a superstrate 650 are shown in FIGS. 6A-6E.

Figure 6A:
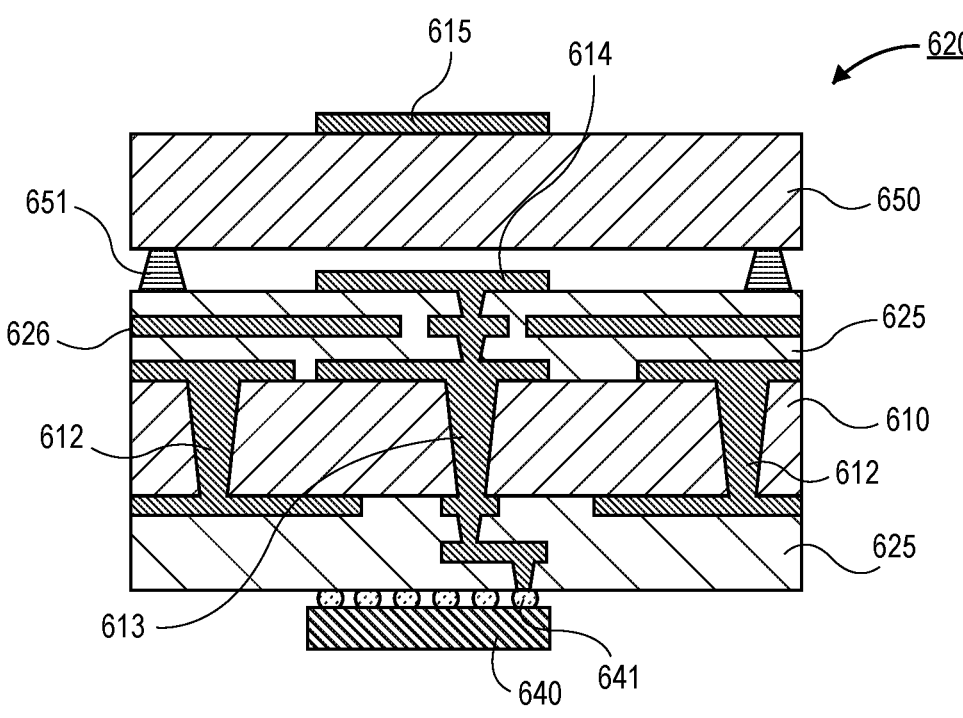
FIG. 6A is a cross-sectional illustration of an electronic package with a stacked patch antenna with a superstrate, in accordance with an embodiment.

Referring now to FIG. 6A, a cross-sectional illustration of an electronic package 620 is shown, in accordance with an embodiment. In an embodiment, the electronic package 620 comprises a core 610. The core 610 may be a glass core similar to cores described in greater detail above. In an embodiment, buildup layers 625 may be provided above and below the core 610. Vias 612 may pass through the core 610 to electrically isolate the signal. In an embodiment, a feed via 613 may couple the bottom patch 614 to the vias 641 and die 640. In an embodiment, the die 640 may be a transceiver die. Conductive routing 626 may be provided within the buildup layers 625.

In an embodiment, the antenna structure may comprise the bottom patch 614 and a top patch 615. The top patch 615 may be provided over a superstrate 650. The superstrate 650 may be coupled to the top side buildup layers 625 by solder 651 or any other architecture for attaching two substrates together. In an embodiment, the superstrate 650 may also be a glass substrate. In some embodiments, the superstrate 650 may comprise the same material as the core 610. In the particular embodiment shown in FIG. 6A, there is no additional conductive routing in the superstrate 650. Though it is to be appreciated that there may be some conductive routing in the superstrate 650 in other embodiments. In FIG. 6A, it is to be appreciated that not all materials of the electronic package 620 are shown for simplicity. For example, underfill materials, overmold materials, and the like may be provided around one or more components of electronic package 620.

Figure 6B:
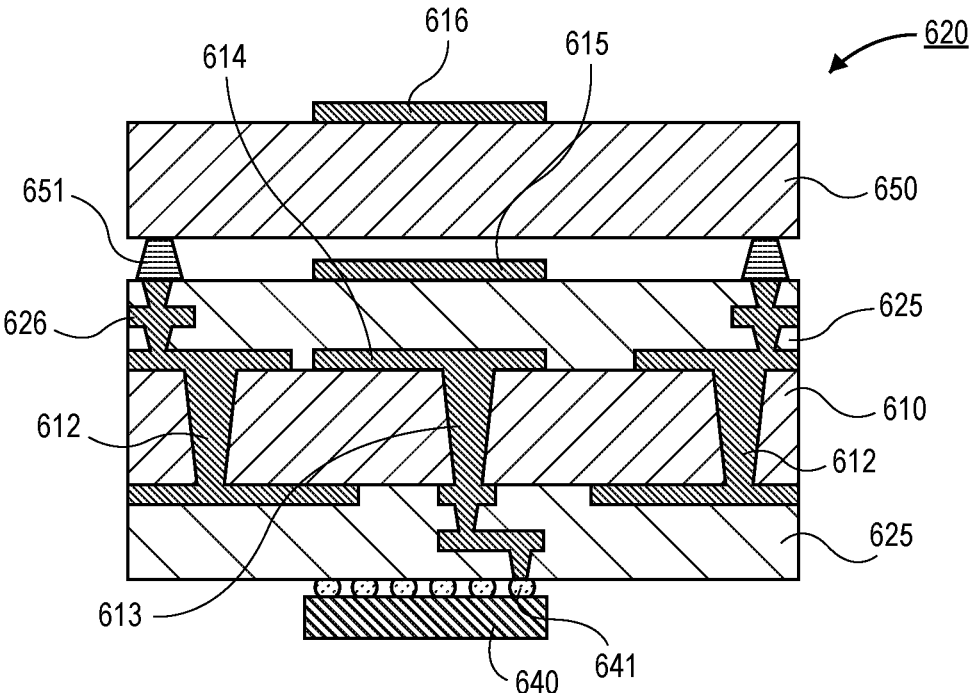
FIG. 6B is a cross-sectional illustration of an electronic package with a stacked patch antenna with three patches and a superstrate, in accordance with an embodiment.

Referring now to FIG. 6B, a cross-sectional illustration of an electronic package 620 is shown, in accordance with an additional embodiment. In an embodiment, the electronic package 620 in FIG. 6B may be substantially similar to the electronic package 620 in FIG. 6A, with the exception of the architecture of the antenna. Instead of being a dual patch antenna, the embodiment shown in FIG. 6B is an antenna with three patches. For example, a first patch 614 may be provided on the top surface of the core 610, a second patch 615 may be provided on a top surface of the top buildup layers 625, and a third patch 616 may be provided on a top surface of the superstrate 650. The inclusion of additional patches allows for an increase in the bandwidth of the antenna.

Figure 6C:
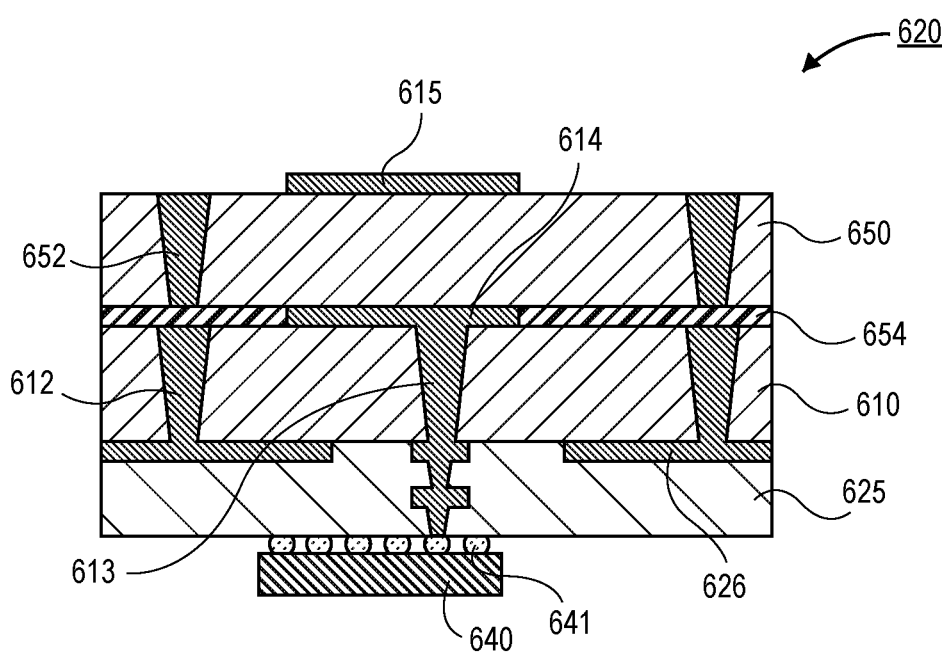
FIG. 6C is a cross-sectional illustration of an electronic package with a stacked patch antenna with a superstrate that is bonded to the core with a hybrid bonding architecture, in accordance with an embodiment.

Referring now to FIG. 6C, a cross-sectional illustration of an electronic package 620 is shown, in accordance with an additional embodiment. In an embodiment, the electronic package comprises a core 610 that is bonded to a superstrate 650. For example, the bonding may be a hybrid bonding or fusion bonding interface 654. The bottom patch 614 may be over a top surface of the core 610, and the top patch 615 may be over a top surface of the superstrate 650. In addition to vias 612 through the core 610, vias 652 may be provided in the superstrate 650. Additionally, while the patches 614 and 615 are shown protruding from the core 610 surface and the superstrate 650 surface, it is to be appreciated that laser-assisted etching process allow for the patches 614 and/or 615 to be embedded in the substrate with a surface flush with the core 610 surface or the superstrate 650 surface. Such an embodiment may be particularly useful for fusion or hybrid bonding architectures.

Figure 6D:
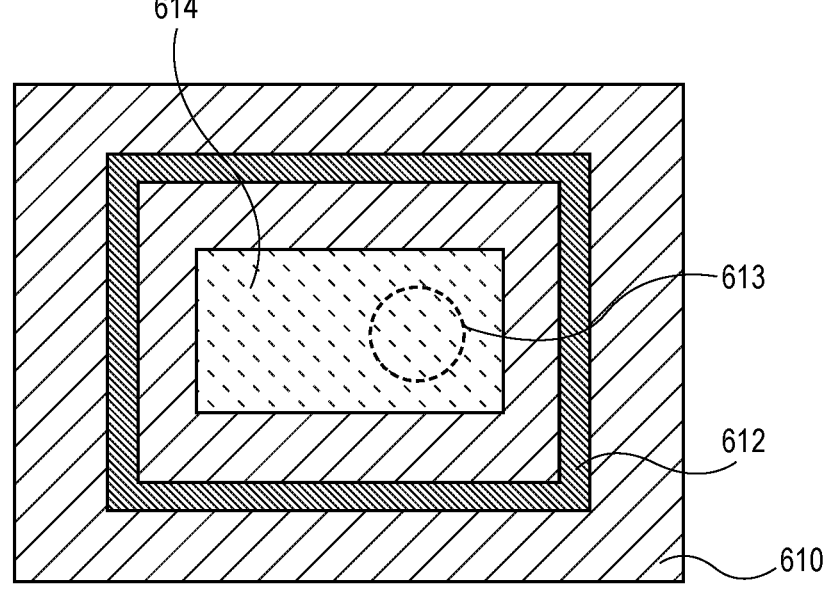
FIG. 6D is a plan view illustration of an electronic package illustrating a blind via plane around a perimeter of a patch of a stacked patch antenna, in accordance with an embodiment.

Referring now to FIG. 6D, a plan view illustration of a portion of the core 610 is shown, in accordance with an embodiment. The plan view in FIG. 6D may be similar to plan views taken of FIGS. 6A-6C around the bottom patch 614. As shown, the via 612 may be a via plane that surrounds a perimeter of the bottom patch 614. In some instances the via plane 612 may be a blind structure. That is, the via plane 612 may not pass entirely through a thickness of the core 610. In an embodiment, the feed via 613 that is electrically coupled to the bottom patch 614 may have a circular shape. However, embodiments are not limited to such configurations.

Figure 6E:
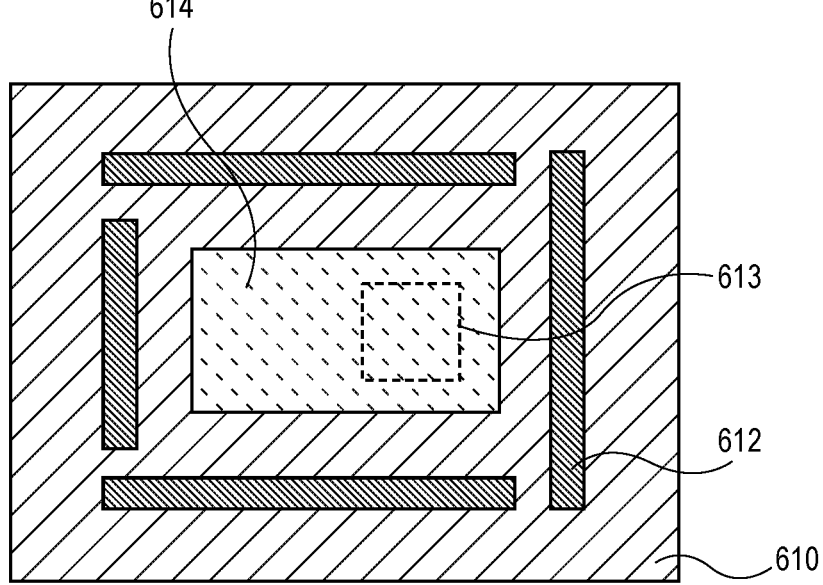
FIG. 6E is a plan view illustration of an electronic package illustrating via planes around a perimeter of a patch of a stacked patch antenna, in accordance with an embodiment.

Referring now to FIG. 6E, a plan view illustration of a portion of the core 610 is shown, in accordance with an additional embodiment. As shown, the plane vias 612 may not be connected around an entire perimeter of the bottom patch 614. The segmented nature of the plane vias 612 may ease fabrication when the plane vias 612 extend entirely through a thickness of the core 610. That is, the region of the core 610 inside the plane vias 612 remains attached to portion of the core 610 outside of the plane vias 612. Additionally, FIG. 6E illustrates that the cross-section of the feed via 613 is not limited to circular cross-sections, as is shown in FIG. 6D. For example, the feed via 613 may include a rectangular cross-section in some embodiments.

Figure 7:
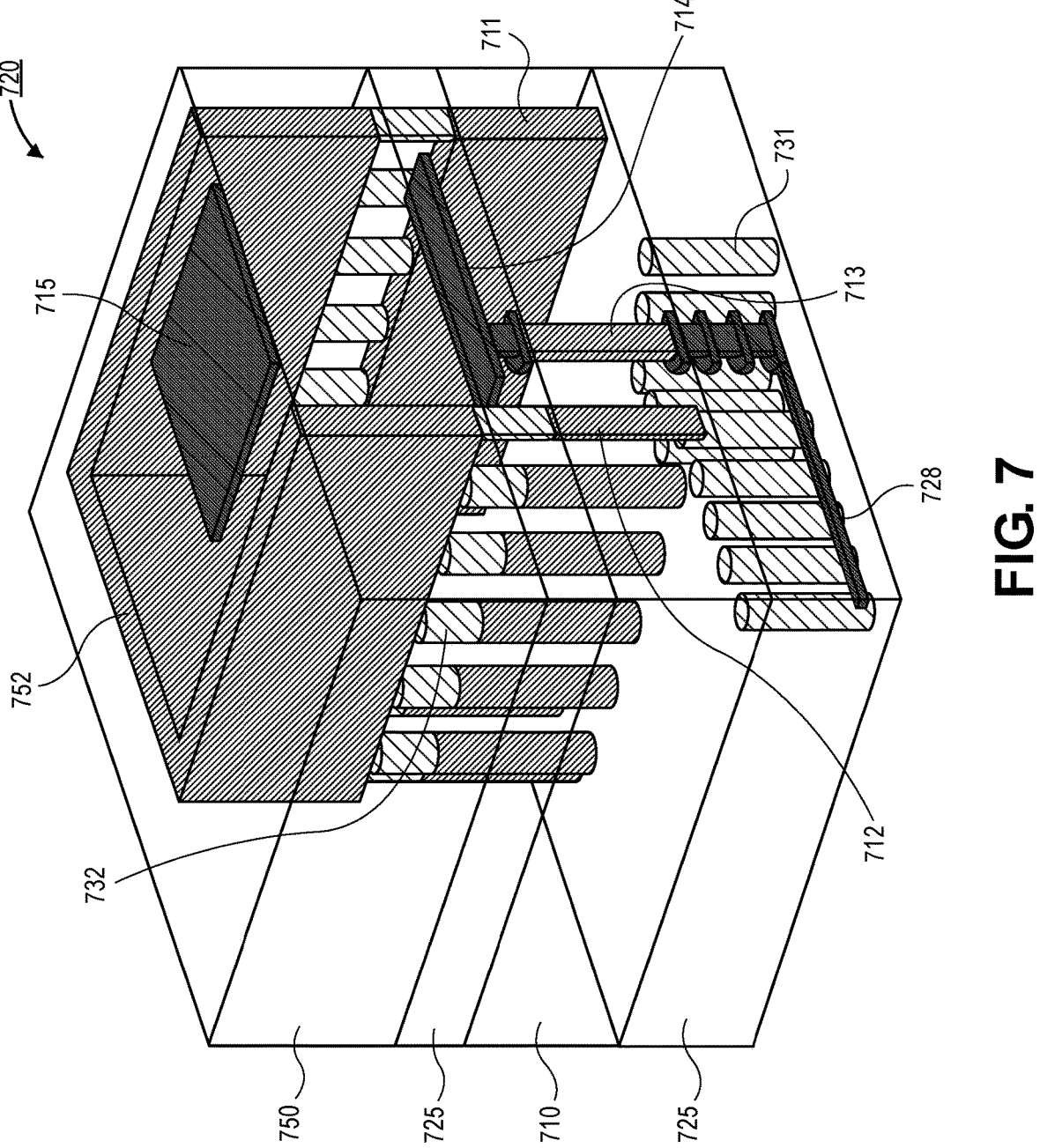
FIG. 7 is a perspective view illustration of an electronic package with a stacked patch antenna with a via plane through the superstrate around a patch of the stacked patch antenna, in accordance with an embodiment.

Referring now to FIG. 7, a perspective view illustration of an electronic package 720 is shown, in accordance with an embodiment. The electronic package 720 in FIG. 7 may be similar to the electronic package 620 in FIG. 6A. Though, it is to be appreciated that similar structures may be present in perspective view illustrations of FIGS. 6B and 6C.

As shown in FIG. 7, the electronic package 720 comprises a core 710 with buildup layers 725 above and below the core 710. Isolation vias 732 and 731 may be provided through the buildup layers 725. For example, the isolation vias 732 may surround a perimeter of the antenna, and the isolation vias 731 may surround the feed line 728. Additionally, it is to be appreciated that vias 712 and/or via planes 711 may be formed through a thickness of the core 710. A feed via 713 may couple the feed line 728 to the bottom patch 714.

In an embodiment, the bottom patch 714 may be provided in the top buildup layers 725, and the top patch 715 may be provided over the superstrate 750. The superstrate 750 may also include via planes 752 that surround a perimeter of the top patch 715. Additionally, while shown as via planes 752, in some embodiments, a plurality of discrete vias may be used instead of (or in addition to) the via planes 752. While shown around three sides of the top patch 715, it is to be appreciated that another via plane 752 may surround the fourth side of the top patch 715. Similarly, vias 712 or via planes 711 may wrap around the front surface of the core 710 to fully surround the antenna.

Referring now to FIGS. 8A-8E, a series of cross-sectional illustrations depicting various antenna architectures that can be fabricated using laser assisted etching processes is shown, in accordance with various embodiments.

Figure 8A:
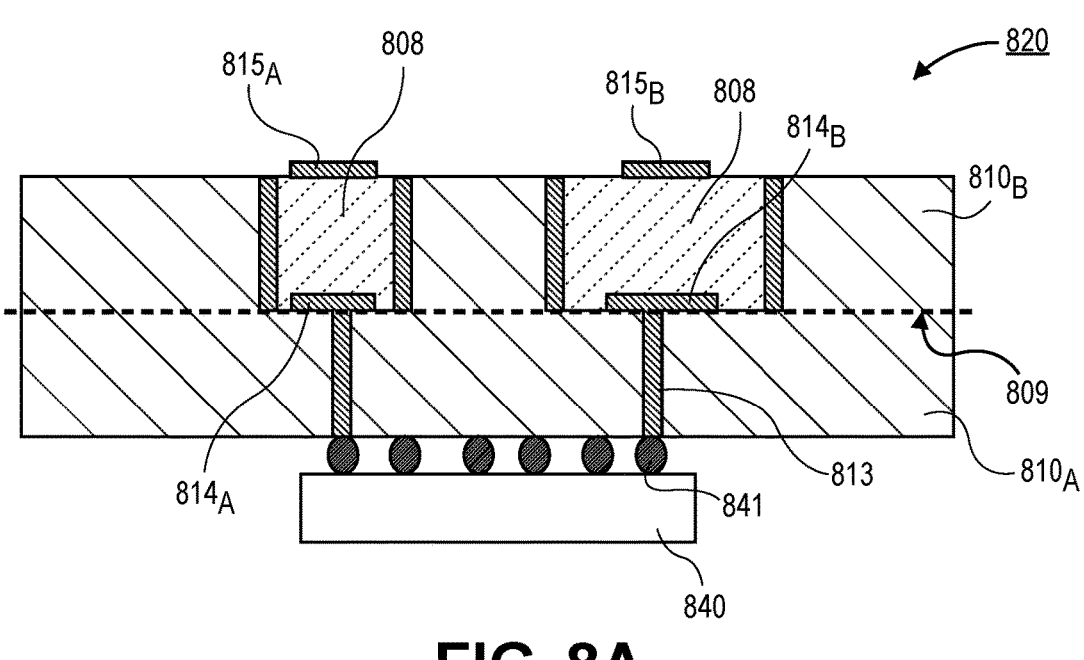
FIG. 8A is a cross-sectional illustration of an electronic package with a pair of stacked patch antennas that radiate out a top surface of the core, in accordance with an embodiment.

Referring now to FIG. 8A, a cross-sectional illustration of an electronic package 820 is shown, in accordance with an embodiment. As shown, the electronic package 820 comprises a core 810 that is directly coupled to a die 840 by interconnects 841. For example, the die 840 may be a transceiver die in some embodiments. In an embodiment, the core 810 may be split into a first core $810_A$ and a second core $810_B$. The two cores may be bonded together at seam 809 in order to form the features shown. For example, the antenna structures may be formed in the top core $810_B$ and the feed vias 813 may be formed in the bottom core $810_A$.

In the illustrated embodiment, a pair of antennas are shown. A first antenna comprises a bottom patch $814_A$ and a top patch $815_A$, and a second antenna comprises a bottom patch $814_B$ and a top patch $815_B$. The two antennas may have different dimensions in order to operate at different frequencies. While different widths are shown, it is to be appreciated that the two antennas may also have different depths into the core $810_B$. Additionally, the space between the top patches 815 and the bottom patches 814 may be filled with a filler material 808. The filler material 808 may be used when a via opening is formed into the top core $810_B$ in order to form the bottom patches 814. After the bottom patches 814 are formed, the filler material is deposited into the via openings, and the top patches 815 may be formed over the filler material 808. The filler material 808 may be a low loss material. In some embodiments, the filler material 808 comprises the same material as the core $810_B$. In yet another embodiment, a dual sided process may be used to form the bottom patches 814 and the top patches 815 without needing to use a filler material. In such an instance, blind openings are formed into the top surface of the core $810_B$ and the bottom surface of the core $810_B$, and the region between the top patch 815 and the bottom patch 814 is never removed.

Figure 8B:
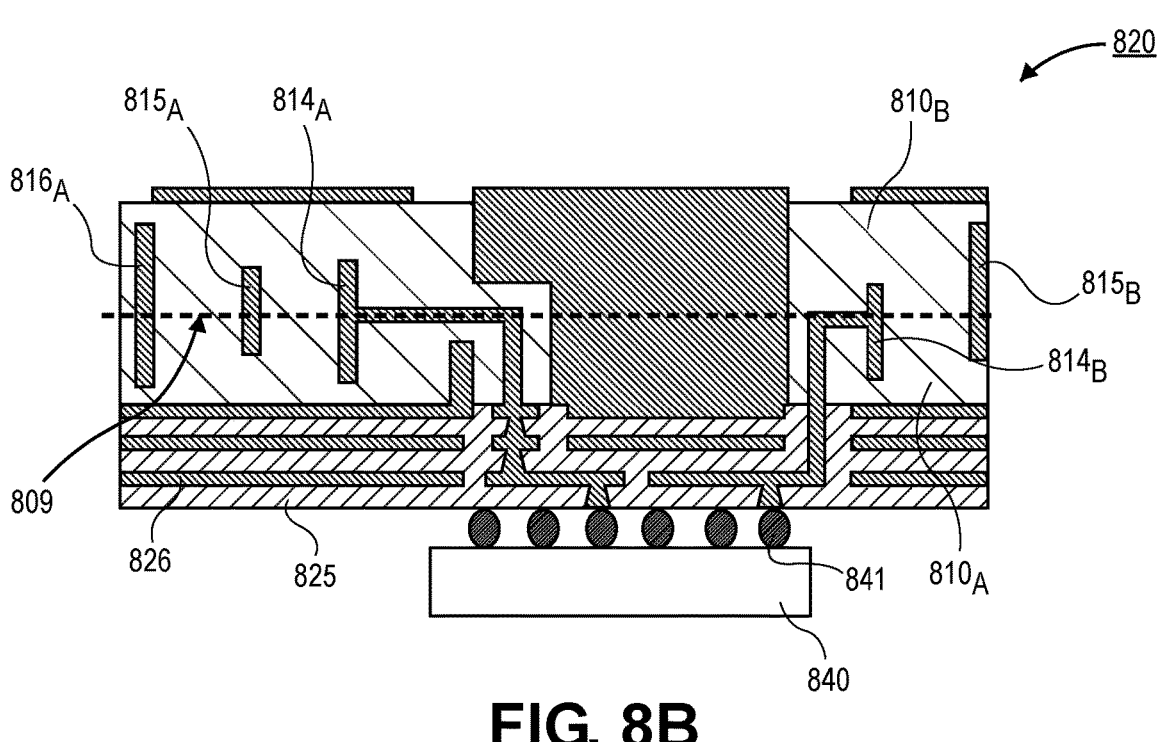
FIG. 8B is a cross-sectional illustration of an electronic package with a pair of stacked patch antennas that radiate out from side surfaces of the core, in accordance with an embodiment.

Referring now to FIG. 8B, a cross-sectional illustration of an electronic package 820 is shown, in accordance with an additional embodiment. As shown, the antennas are oriented ninety degrees compared to the antennas in FIG. 8A. As such, the signals from the antennas are propagated out sidewalls of the core 810. Similar to FIG. 8A, the core 810 may comprise a top core $810_B$ and a bottom core $810_A$ that are coupled together at a seam 809.

In an embodiment, the first antenna comprises a first patch $814_A$, a second patch $815_A$, and a third patch $816_A$. In an embodiment, the second antenna comprises a first patch $814_B$ and a second patch $815_B$. As such, the different antennas do not need to have the same number of patches in some embodiments. In an embodiment, the antennas are coupled to the die 840 through conductive routing 826 in the buildup layers 825 and the interconnect 841.

Figure 8C:
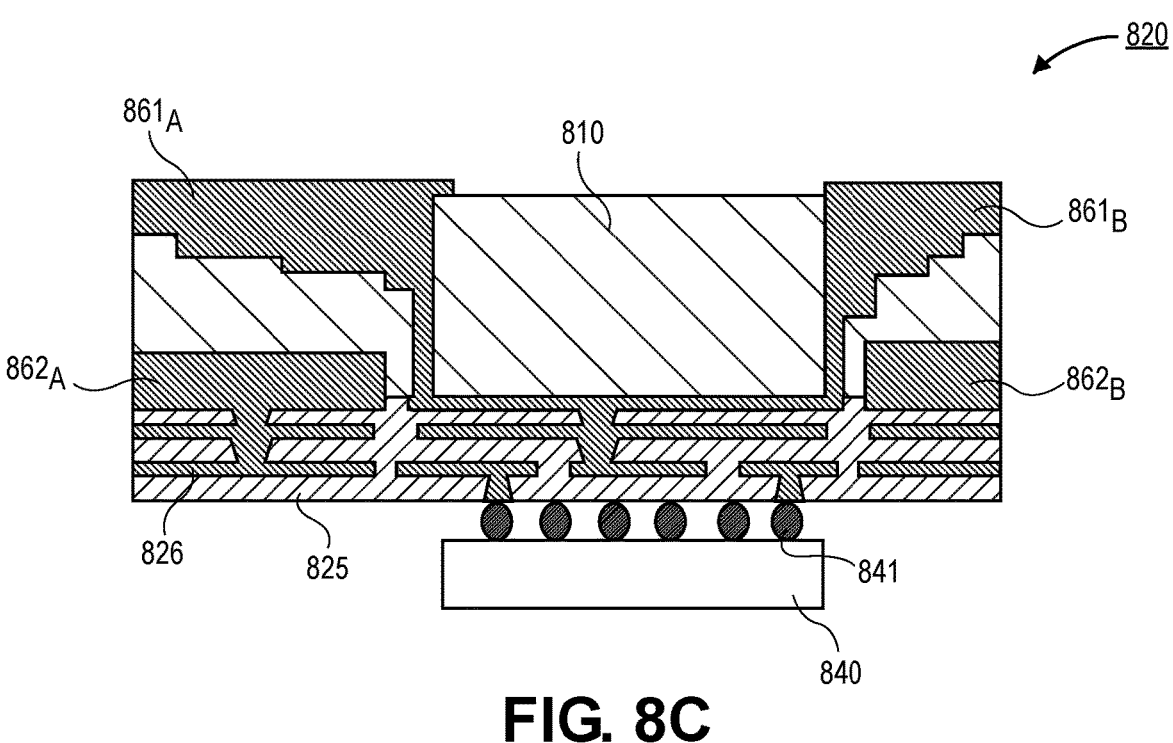
FIG. 8C is a cross-sectional illustration of an electronic package with a pair of Vivaldi antennas that radiate out from side surfaces of the core, in accordance with an embodiment.

Referring now to FIG. 8C, a cross-sectional illustration of an electronic package 820 is shown, in accordance with an additional embodiment. The electronic package 820 in FIG. 8C comprises a core 810 that is provided over buildup layers 825. In an embodiment, a die 840 is coupled to the buildup layers 825 by interconnects 841. The antenna structures in FIG. 8C are Vivaldi type antennas. As such, each antenna includes a stepped fin $861_A$ and $861_B$ and a guide $862_A$ and $862_B$. In some embodiments, the guides 862 may also be stepped structures or similarly functional (e.g., a smooth taper). In an embodiment, the antennas direct the signals out sidewall surfaces of the core 810.

Figure 8D:
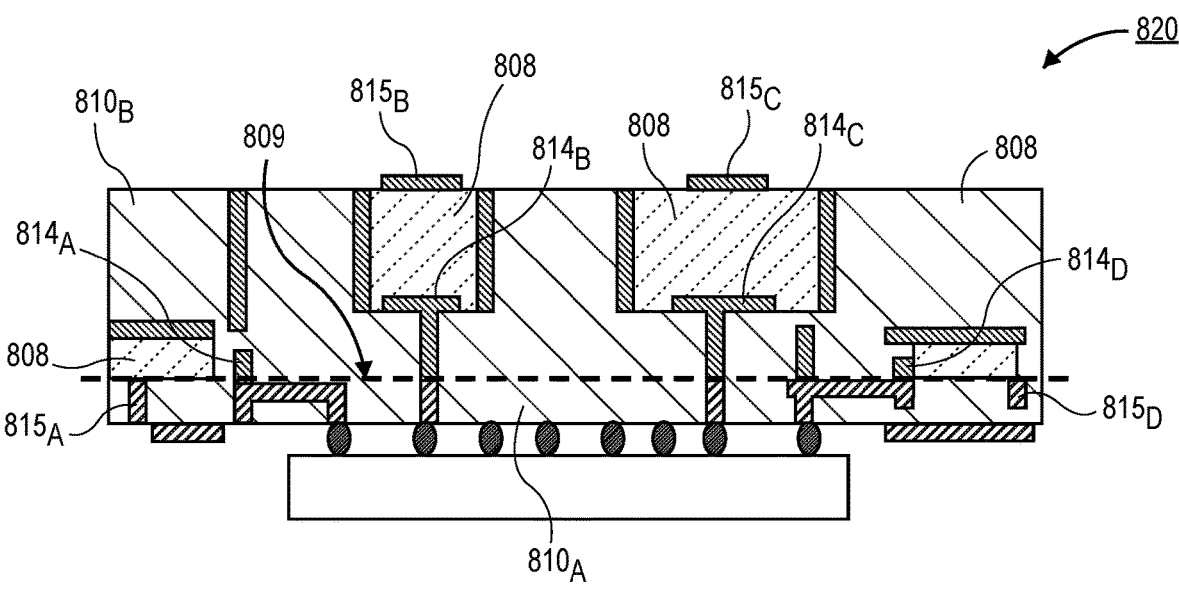
FIG. 8D is a cross-sectional illustration of an electronic package with a plurality of stacked patch antennas that radiate out a top surface of the core and sidewall surfaces of the core, in accordance with an embodiment.

Referring now to FIG. 8D, a cross-sectional illustration of an electronic package 820 is shown, with yet another embodiment. The core 810 may comprise a first core $810_A$ and a second core $810_B$ that meet at interface 809. In an embodiment, a set of four antennas are provided. Each antenna comprises a first patch $814_{A-D}$ and a second patch $815_{A-D}$. The first antenna (i.e., patch $814_A$ and patch $815_A$) and the fourth antenna (i.e., patch $814_D$ and patch $815_D$) propagate signals laterally out the sidewalls of the core 810. The second antenna (i.e., patch $814_B$ and patch $815_B$) and the third antenna (i.e., patch $814_C$ and patch $815_C$) propagate signals vertically out the top surface of the core 810. In an embodiment, fill material 808 may fill portions of the antennas in order to accommodate that laser assisted etching processes. The fill material 808 may be substantially similar to fill material described in greater detail above. Such an arrangement of horizontal and vertical antennas will also contribute to wideband operations/increased bandwidth density.

Figure 8E:
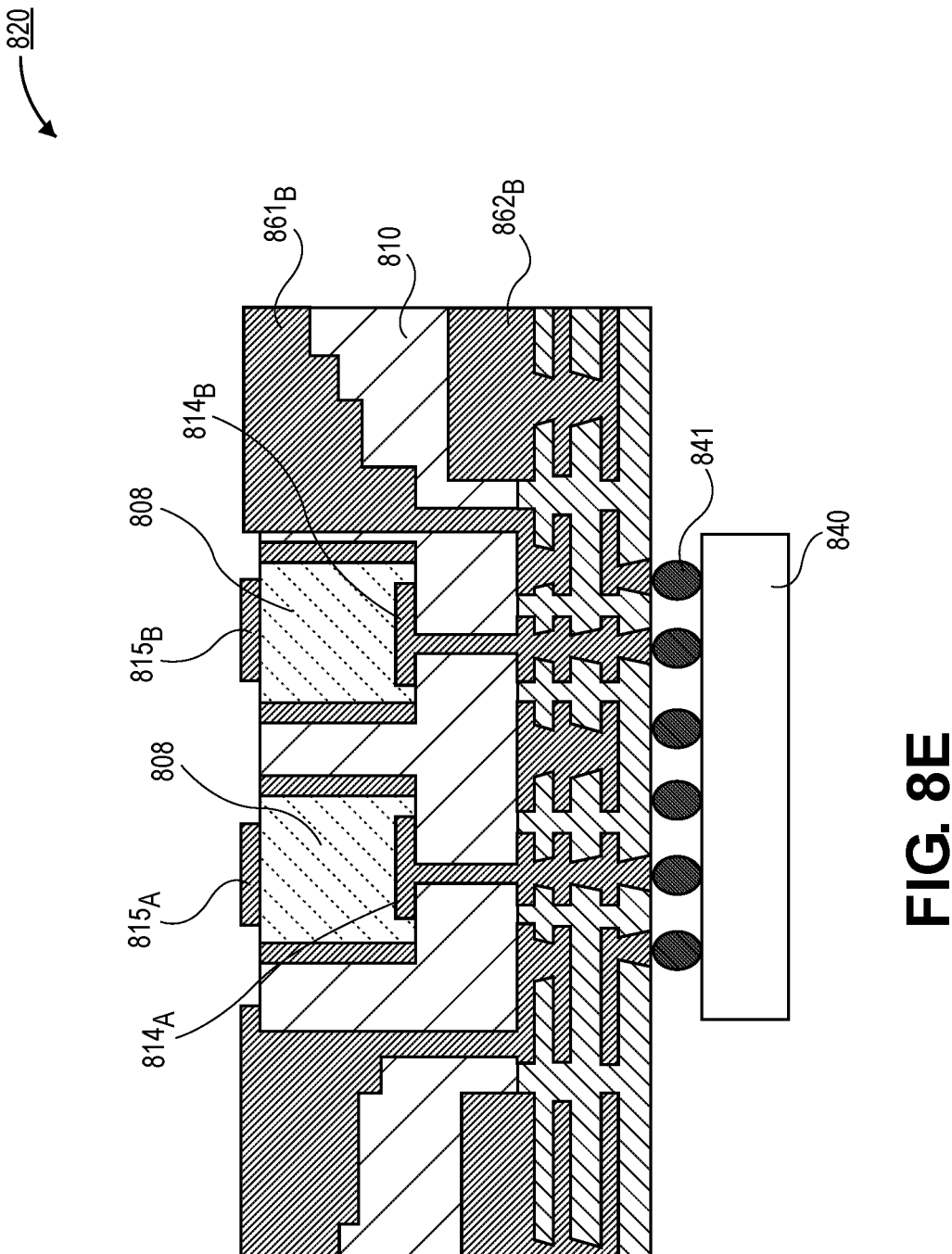
FIG. 8E is a cross-sectional illustration of an electronic package with a pair of stacked patch antennas that radiate out a top surface of the core and a pair of Vivaldi antennas that radiate out from side surfaces of the core, in accordance with an embodiment.

Referring now to FIG. 8E, a cross-sectional illustration of an electronic package 820 is shown, in accordance with yet another embodiment. As shown, two different kinds of antennas are provided in a single package. For example Vivaldi type antennas (861$_{A-B}$ and 862$_{A-B}$) launch signals out the side of the core 810, and patch type antennas (814$_{A-B}$ and 815$_{A-B}$) launch signals out the top surface of the core 810. In an embodiment, both types of antennas may be fabricated from a single core 810. In some instances, fill material 808 may be used (e.g., fill material 808 is used in the patch type antennas 814$_{A-B}$ and 815$_{A-B}$).

Figure 9A:
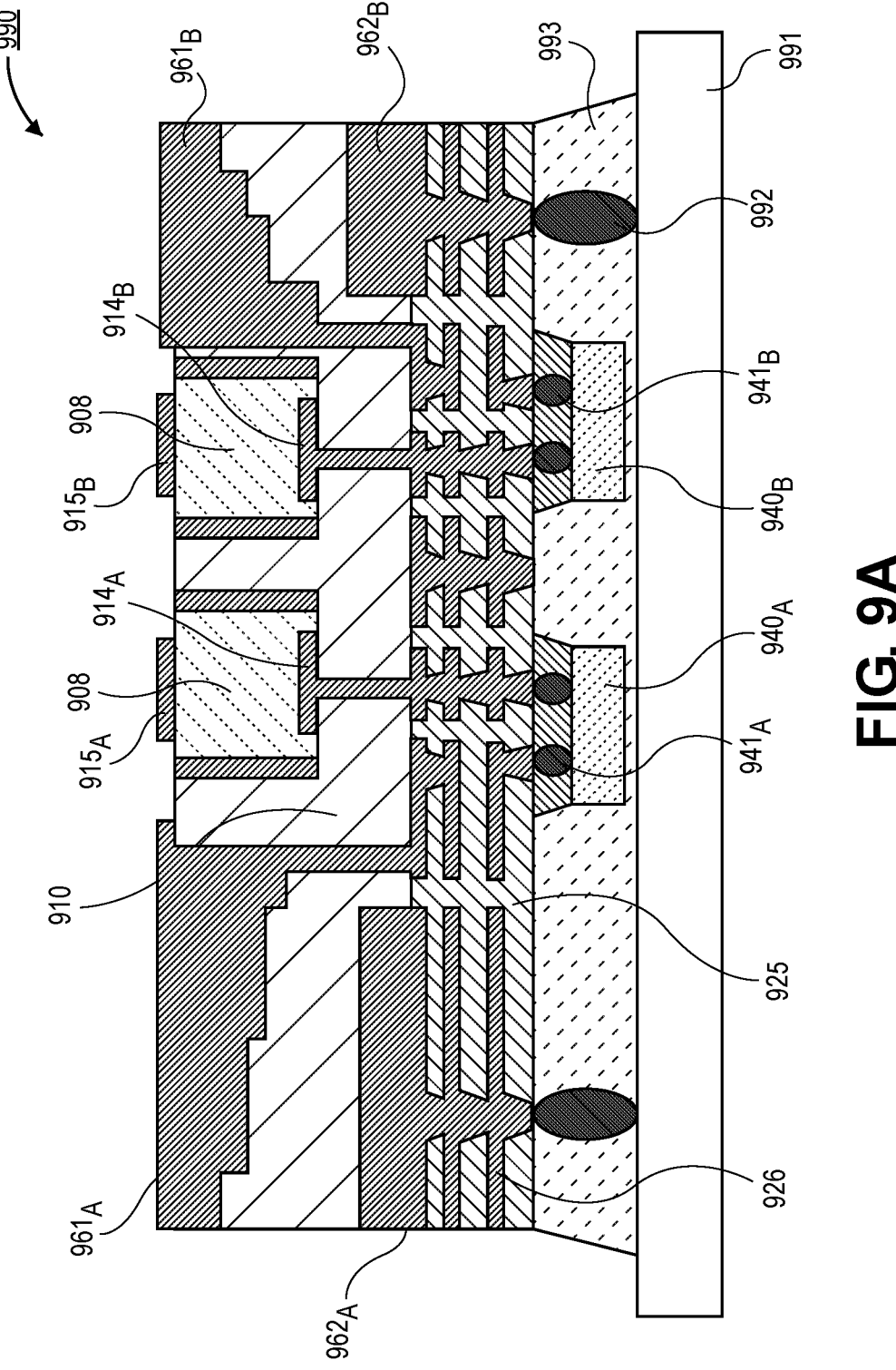
FIG. 9A is a cross-sectional illustration of an electronic system with a core that comprises stacked patch antennas and Vivaldi antennas, in accordance with an embodiment.
Figure 9B:
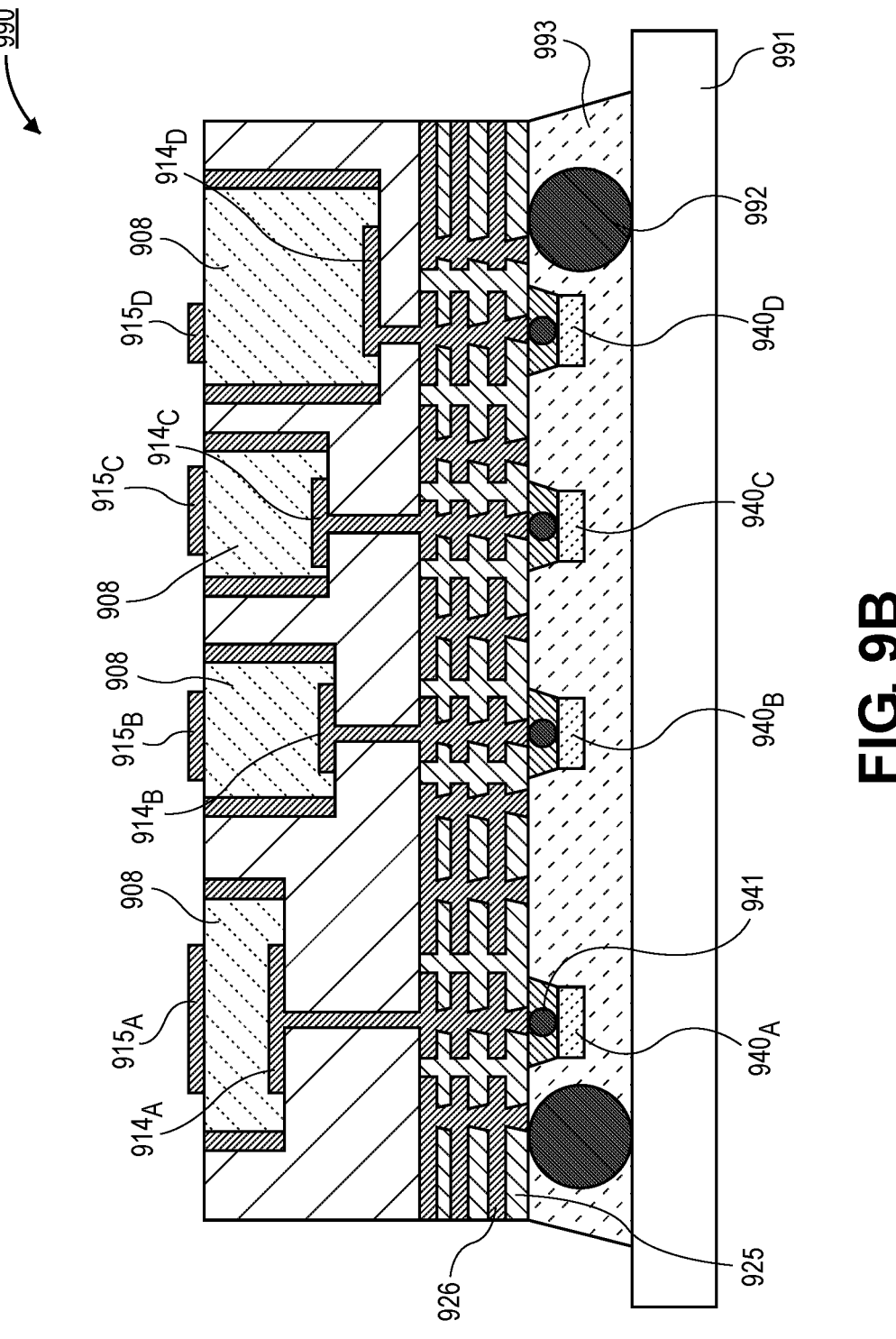
FIG. 9B is a cross-sectional illustration of an electronic system with a plurality of stacked patch antennas in a core, in accordance with an embodiment.

Referring now to FIGS. 9A and 9B, cross-sectional illustrations of electronic systems 990 are shown, in accordance with various embodiments. In both electronic systems 990, the electronic package is coupled to a board 991 (e.g., a printed circuit board (PCB)) by interconnects 992. The interconnects 992 may provide sufficient standoff height in order to allow for one or more dies 940 to be provided below the electronic package. In an embodiment, the interconnects 992 and the dies 940 may be surrounded by an underfill 993.

Referring now to FIG. 9A, a cross-sectional illustration of an electronic system 990 is shown, in accordance with an embodiment. In an embodiment, the electronic system 990 may comprise an electronic package that includes a core 910 and buildup layers 925. Conductive routing 926 in the buildup layers 925 and interconnects 941$_A$ and 941$_B$ may couple dies 940$_A$ and 940$_B$ to the antennas in the core 910. In an embodiment, first antennas (i.e., a Vivaldi type antenna (961$_A$ and 962$_A$) and patch type antenna (914$_A$ and 915$_A$) are coupled to the first die 940$_A$, and second antennas (i.e., a Vivaldi type antenna (961$_B$ and 962$_B$) and patch type antenna (914$_B$ and 915$_B$) are coupled to the second die 940$_B$.

Referring now to FIG. 9B, a cross-sectional illustration of an electronic system 990 is shown, in accordance with an additional embodiment. In FIG. 9B, each of the antennas are patch antennas with a bottom patch 914$_{A-D}$ and a top patch 915$_{A-D}$. Fill material 908 may also be provided in each antenna. In an embodiment, the four antennas have different dimensions. As such, an antenna array that accommodates a larger bandwidth may be provided. In an embodiment, each of the antennas may be coupled to a different die 940$_{A-D}$.

Figure 10:
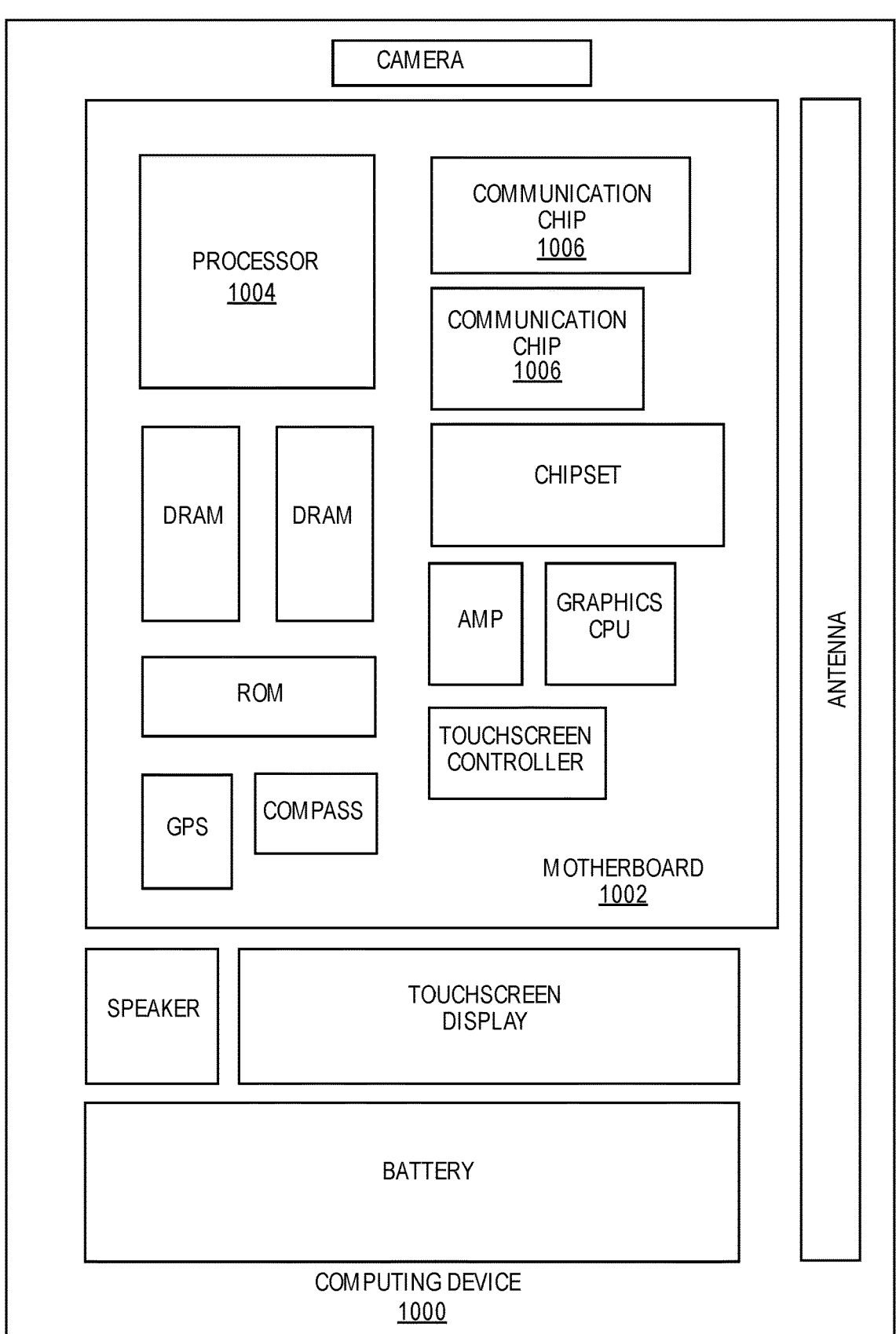
FIG. 10 is a schematic of a computing device built in accordance with an embodiment.

FIG. 10 illustrates a computing device 1000 in accordance with one implementation of the invention. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some implementations of the invention, the integrated circuit die of the processor may be part of an electronic package that comprises a glass core with one or more antennas fabricated with a laser assisted etching process, in accordance with embodiments described herein. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. In accordance with another implementation of the invention, the integrated circuit die of the communication chip may be part of an electronic package that comprises a glass core with one or more antennas fabricated with a laser assisted etching process, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: a core, wherein the core comprises glass; a buildup layer over the core; a patch antenna with a first patch under the core, and a second patch over a surface of the core opposite from the first patch; and a via through the core and coupled to the patch antenna.

Example 2: the electronic package of Example 1, wherein the core has a first surface and a second surface opposite from the first surface, wherein the first patch is on the first surface and the second patch is on the second surface.

Example 3: the electronic package of Example 1 or Example 2, wherein a recess is formed into the core to provide a recessed surface, and wherein the second patch is over the recessed surface.

Example 4: the electronic package of Example 3, further comprising: a waveguide inserted into the recess.

Example 5: the electronic package of Examples 1-4, further comprising conductive pillars in the buildup layer around the patch antenna.

Example 6: the electronic package of Example 5, further comprising: vias through the core, wherein individual ones of the vias are aligned under individual ones of the conductive pillars.

Example 7: the electronic package of Example 6, wherein a diameter of the vias is substantially equal to a diameter of the conductive pillars.

Example 8: the electronic package of Examples 5-7, further comprising: a conductive plane through a thickness of the core, wherein the conductive plane is aligned under a plurality of the conductive pillars.

Example 9: an electronic package, comprising: a core, wherein the core comprises glass; a buildup layer on the core; a superstrate over the core; a patch antenna, wherein a first patch is under the superstrate and a second patch is over the superstrate; and a via through the core and coupled to the first patch.

Example 10: the electronic package of Example 9, wherein the first patch is on the buildup layer.

Example 11: the electronic package of Example 9 or Example 10, further comprising: a third patch over the core.

Example 12: the electronic package of Examples 9-11, wherein the buildup layer is on a surface of the core opposite from the superstrate.

Example 13: the electronic package of Example 12, wherein the superstrate is bonded to the core.

Example 14: the electronic package of Example 13, wherein the superstrate is bonded to the core with a hybrid bonding interface.

Example 15: the electronic package of Examples 9-14, further comprising: a blind via plane in the core, wherein the blind via plane surrounds a perimeter of the first patch.

Example 16: the electronic package of Examples 9-15, further comprising: a plurality of via planes through a thickness of the core, wherein the plurality of via planes are spaced apart from each other and a positioned around a perimeter of the first patch.

Example 17: the electronic package of Examples 9-16, wherein the via has a circular cross-section.

Example 18: the electronic package of Examples 9-17, wherein the via has a rectangular cross-section.

Example 19: the electronic package of Examples 9-18, further comprising: a via plane through the superstrate, wherein the via plane surrounds a perimeter of the second patch.

Example 20: an electronic package, comprising: a core, wherein the core comprises glass and has a first surface and a second surface opposite from the first surface, and a third surface and a fourth surface opposite from the third surface, wherein the third surface and the fourth surface couple the first surface to the second surface; and an antenna at least partially embedded in the core.

Example 21: the electronic package of Example 20, wherein the antenna radiates out the first surface of the core or out the third surface of the core.

Example 22: the electronic package of Example 20 or Example 21, further comprising a second antenna, wherein the antenna radiates out the first surface of the core, and wherein the second antenna radiates out the third surface of the core.

Example 23: an electronic system, comprising: a board; a package module coupled to the board, wherein the package module comprises: a core; a buildup layer over the core; a first antenna in the core; and a second antenna in the core; and a die coupled to the first antenna.

Example 24: the electronic system of Example 23, wherein the first antenna is a different structure than the second antenna.

Example 25: the electronic system of Example 23 or Example 24, further comprising a via through the core and coupled to the first antenna.

What is claimed is:

1. An electronic package, comprising:
   a core, wherein the core comprises glass;
   a buildup layer over the core;
   a patch antenna with a first patch under the core, and a second patch over a surface of the core opposite from the first patch, wherein the first patch and the second patch are directly on the core;
   a via through the core;
   conductive pillars in the buildup layer around the patch antenna; and
   vias through the core, wherein individual ones of the vias are aligned under individual ones of the conductive pillars.

2. The electronic package of claim 1, wherein the core has a first surface and a second surface opposite from the first surface, wherein the first patch is on the first surface and the second patch is on the second surface.

3. The electronic package of claim 1, wherein a recess is formed into the core to provide a recessed surface, and wherein the second patch is over the recessed surface.

4. The electronic package of claim 3, further comprising:
   a waveguide inserted into the recess.

5. The electronic package of claim 1, wherein a diameter of the vias is substantially equal to a diameter of the conductive pillars.

6. The electronic package of claim 1, further comprising:
   a conductive plane through a thickness of the core, wherein the conductive plane is aligned under a plurality of the conductive pillars.

7. An electronic package, comprising:
   a core, wherein the core comprises glass;
   a buildup layer on the core;
   a superstrate over the core, wherein the buildup layer is on a surface of the core opposite from the superstrate, and wherein the superstrate is bonded to the core with a hybrid bonding interface;
   a patch antenna, wherein a first patch is under the superstrate and a second patch is over the superstrate, the second patch directly on the superstrate; and
   a via through the core and coupled to the first patch.

8. The electronic package of claim 7, wherein the first patch is on the buildup layer.

9. The electronic package of claim 7, further comprising:
   a third patch over the core.

10. The electronic package of claim 7, further comprising:
    a blind via plane in the core, wherein the blind via plane surrounds a perimeter of the first patch.

11. The electronic package of claim 7, further comprising:

a plurality of via planes through a thickness of the core, wherein the plurality of via planes are spaced apart from each other and a positioned around a perimeter of the first patch.

12. The electronic package of claim 7, wherein the via has a circular cross-section.

13. The electronic package of claim 7, wherein the via has a rectangular cross- section.

14. The electronic package of claim 7, further comprising:

a via plane through the superstrate, wherein the via plane surrounds a perimeter of the second patch.

15. An electronic package, comprising:

a core, wherein the core comprises glass, wherein a recess is formed into the core to provide a recessed surface;

a buildup layer over the core;

a patch antenna with a first patch under the core, and a second patch over a surface of the core opposite from the first patch, wherein the first patch and the second patch are directly on the core, and wherein the second patch is over the recessed surface; and a via through the core.

16. The electronic package of claim 15, further comprising:

a waveguide inserted into the recess.

17. An electronic package, comprising:

a core, wherein the core comprises glass;

a buildup layer over the core;

a patch antenna with a first patch under the core, and a second patch over a surface of the core opposite from the first patch, wherein the first patch and the second patch are directly on the core;

a via through the core;

conductive pillars in the buildup layer around the patch antenna; and a conductive plane through a thickness of the core, wherein the conductive plane is aligned under a plurality of the conductive pillars.

* * * * *